United States Patent
Okumura et al.

(10) Patent No.: US 7,403,415 B2
(45) Date of Patent: Jul. 22, 2008

(54) MAGNETIC MEMORY DEVICE

(75) Inventors: Yoshinori Okumura, Tokyo (JP); Shuichi Ueno, Tokyo (JP); Haruo Furuta, Tokyo (JP)

(73) Assignee: Reneasa Technology Corp., Tokyo (JP)

( * ) Notice: Subject to any disclaimer, the term of this patent is extended or adjusted under 35 U.S.C. 154(b) by 0 days.

(21) Appl. No.: 11/698,872

(22) Filed: Jan. 29, 2007

(65) Prior Publication Data

US 2007/0139999 A1    Jun. 21, 2007

Related U.S. Application Data

(63) Continuation of application No. 11/253,696, filed on Oct. 20, 2005, now Pat. No. 7,180,773.

(30) Foreign Application Priority Data

Oct. 21, 2004    (JP)    ............... 2004-306580

(51) Int. Cl.
  *G11C 11/14*    (2006.01)
  *G11C 11/00*    (2006.01)
(52) U.S. Cl. ............ 365/171; 365/158; 257/421; 438/3
(58) Field of Classification Search ............ 365/171
  See application file for complete search history.

(56) References Cited

U.S. PATENT DOCUMENTS

| | | | |
|---|---|---|---|
| 5,986,858 A | 11/1999 | Sato et al. | |
| 6,797,536 B2 * | 9/2004 | Yoda et al. | 438/48 |
| 7,031,183 B2 * | 4/2006 | Kerszykowski et al. | 365/158 |
| 7,038,939 B2 | 5/2006 | Amano et al. | |
| 7,064,402 B2 | 6/2006 | Kajiyama et al. | |
| 2004/0021189 A1 | 2/2004 | Yoda et al. | |
| 2005/0221511 A1 | 10/2005 | Wang et al. | |
| 2006/0209591 A1 * | 9/2006 | Hong et al. | 365/173 |

FOREIGN PATENT DOCUMENTS

| | | |
|---|---|---|
| JP | 2002-231904 A | 8/2002 |
| JP | 2003-86773 A | 3/2003 |
| JP | 2004-296869 A | 10/2004 |

OTHER PUBLICATIONS

Park, J.H., et al. "An 8F2 MRAM Technology using Modified Metal Lines." IEDM Tech. Dig., 2003, pp. 827-830.

* cited by examiner

*Primary Examiner*—Son L Mai
(74) *Attorney, Agent, or Firm*—McDermott Will & Emery LLP

(57) ABSTRACT

A width and a thickness of a bit line are represented as W1 and T1, respectively, a thickness of a digit line is represented as T2, and a distance from a center of the digit line in a thickness direction to a center of a free layer of an MTJ element in the thickness direction is represented as L1. A width of the digit line is represented as W2, and a distance from a center of the bit line in the thickness direction to the center of the free layer of the MTJ element in the thickness direction is represented as L2. The distances L1 and L2 and the cross-sectional areas S1 and S2 are set in such a manner that when $L1/L2 \geq 1$, a relation of $(1/3) \cdot (L1/L2) \leq S2/S1 \leq 1$ is satisfied and when $L1/L2 \leq 1$, a relation of $1 \leq S2/S1 \leq 3(L1/L2)$ is satisfied.

4 Claims, 4 Drawing Sheets

MAGNETIC MEMORY DEVICE

RELATED APPLICATIONS

This application is a continuation of U.S. Ser. No. 11/253,696, filed Oct. 20, 2005, U.S. Pat. No. 7,180,773, which claims priority on Japanese Patent Application No. 2004-306580, filed Oct. 21, 2004, both of which are incorporated herein by reference.

BACKGROUND OF THE INVENTION

1. Field of the Invention

The present invention relates to a magnetic memory device. In particular, the present invention relates to a magnetic memory device using a magnetic tunnel junction.

2. Description of the Background Art

A structure in which an insulator is sandwiched between two ferromagnetic materials is called "magnetic tunnel junction (MTJ)".

In this structure, when a current tunneling the insulator is measured, it is observed that the measured current value varies depending on the directions of magnetization of the two ferromagnetic layers.

This phenomenon is called "tunnel magnetic resistance (TMR) effect". The TMR effect is disclosed in detail in Japanese Patent Application Laid-Open No. 2002-231904.

A device for storing data in use of the above TMR effect, which makes correspondence between the magnetization directions of two ferromagnetic layers and two values, "0" and "1", is an "MRAM (Magnetic Random Access Memory)".

An MRAM has a structure in which magnetization directions of ferromagnetic layers are controlled by generating a magnetic field in use of current flowing through write wires, that is, bit lines and digit lines. The bit lines are arranged above the upper ferromagnetic layer and the digit lines are arranged below the lower ferromagnetic layer. Those lines are provided so as to intersect each other in a planer view.

A conventional MRAM has a structure in which an MTJ element is arranged as close to a bit line as possible. For example, as shown in FIG. 1 of Japanese Patent Application Laid-Open No. 2003-86773, generally, MTJ elements are directly brought into contact with lower faces of bit lines.

In the case where the MTJ element is directly brought into contact with the lower face of the bit line, as described above, a difference is generated between current density of the bit line and current density of the digit line required for writing data to MTJ elements. As a result, large difference between operating lives of each write wire may occur, so that there has been a problem that it is difficult to ensure reliability for both types of write wires.

SUMMARY OF THE INVENTION

An object of the present invention is to ensure reliability for two write wires by promoting optimization of a memory cell structure.

A magnetic memory device according to the present invention includes first and second write wires that intersect each other in a non-contact manner, and a magnetic tunnel junction element which is arranged in an intersection of the first and second write wires and includes a magnetic tunnel junction. The magnetic tunnel junction element has a free layer consisting of a ferromagnetic material in which a magnetization direction is variable with a magnetic field generated by current flowing through the first and second write wires. In the case where a distance between a center of the first write wire in a thickness direction and a center of the free layer in the thickness direction is represented as L1, a distance between a center of the second write wire in the thickness direction and a center of the free layer in the thickness direction is represented as L2, a cross-sectional area of the first write wire in a width direction is represented as S2 and a cross-sectional area of the second write wire in a width direction is referred to as S1, the distance L1, the distance L2, the cross-sectional area S1 and the cross-sectional area S2 are set in such a manner that when a ratio of the distance L1 to the distance L2 is $L1/L2 \geq 1$, a relation of $(1/3) \cdot (L1/L2) \leq S2/S1 \leq 1$ is satisfied and when the ratio of the distance L1 to the distance L2 is $L1/L2 \leq 1$, a relation of $1 \leq S2/S1 \leq 3(L1/L2)$ is satisfied.

According to the magnetic memory device, the distance L1, the distance L2, the cross-sectional area S1 and the cross-sectional area S2 are set in such a manner that when $L1/L2 \geq 1$, a relation of $(1/3) \cdot (L1/L2) \leq S2/S1 \leq 1$ is satisfied and when $L1/L2 \leq$ a relation of $1 \leq S2/S1 \leq 3 (L1/L2)$ is satisfied. As a result, it is possible to prevent that difference in each current density becomes large between the first write wire and the second write wire, and the difference of operating lives of the respective wires is kept less than 10 so that reliability for both wires can be ensured.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiments (A. Structure of Device)

Figure 1:
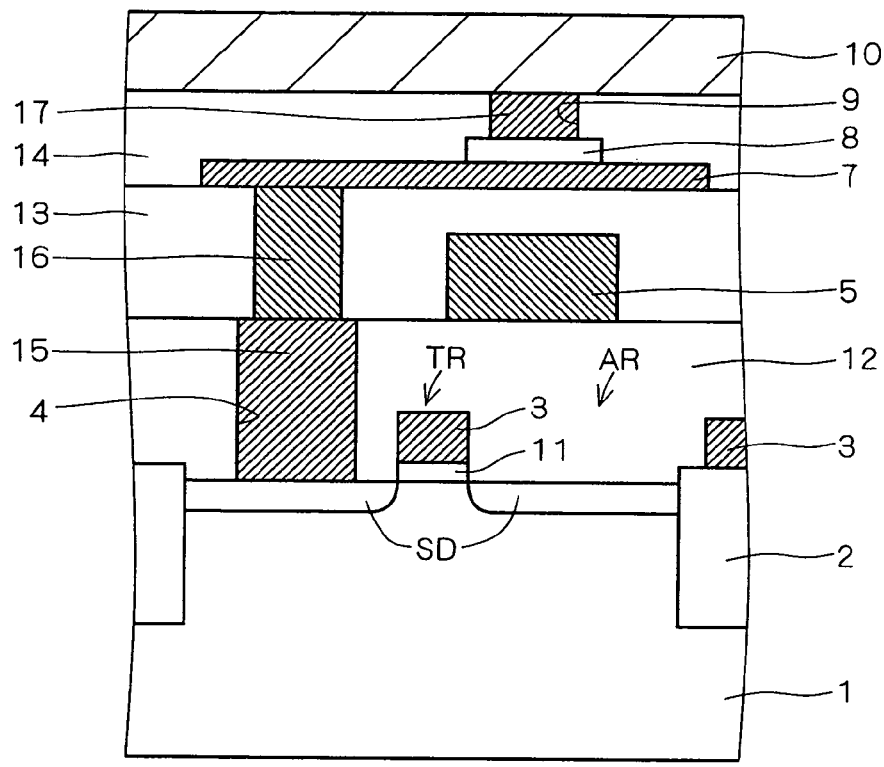
FIG. 1 is a cross-sectional view which illustrates a structure of an MRAM according to an embodiment of the present invention.

First, with reference to FIG. 1, a cross-sectional structure of an MRAM 100 according to an embodiment of the present invention will be described. It is noted that FIG. 1 illustrates one memory cell among a plurality of memory cells constituting the MRAM 100. Here, the description is based on an assumption that a memory cell has one MTJ element 8 for one MOS transistor in the MRAM 100.

As shown in FIG. 1, an isolation oxide film 2 is selectively provided on a main surface of a semiconductor substrate 1 and an active region AR is defined by the isolation oxide film 2.

A gate insulating film 11 is selectively provided on the active region AR and a gate electrode 3 is provided on the gate insulating film 11. Source/drain layers SD are provided on the semiconductor substrate 1 at outer surfaces of both sides of the gate electrode 3 in a direction of a gate length so as to constitute an MOS transistor TR. It is noted that the MOS transistor TR is not be limited thereto. The MOS transistor TR may include an sidewall oxide film on the side surface of the gate electrode 3, or source/drain extension layers which is an impurity diffusion layer shallower than the source/drain layers SD.

The MOS transistor TR is a transistor adapted to read information stored in the MTJ element 8, and it is also called "read word line" because voltage is applied to the gate electrode 3 only at the time of reading information.

An interlayer insulating film 12 is provided so as to cover the MOS transistor TR. A digit line 5 (a first write wire) is provided on the interlayer insulating film 12 so as to extend backward and forward in the view of the drawing.

A contact hole 4 is provided so as to pass through the interlayer insulating film 12 and reach one surface of source/drain layer SD of the MOS transistor TR. The contact hole 4 is filled with a conductive film to constitute a contact plug 15.

An interlayer insulating film 13 is provided so as to cover the interlayer insulating film 12. A local wire 7 is provided on the interlayer insulating film 13 and the MTJ element 8 is selectively provided on the local wire 7.

A contact hole 6 is provided so as to pass through the interlayer insulating film 13 and reach a surface of the contact plug 15. The contact hole 6 is filled with a conductive film to constitute a contact plug 16. The local wire 7 is provided so as to cover the contact plug 16 and the MTJ element 8 is electrically connected to one of the source/drain layers SD of the MOS transistor TR via the local wire 7, the contact plugs 16 and 15.

The other one of the source/drain layers SD is connected to any component via a contact plug (not shown). However, this arrangement has no bearing on the present application; therefore, specific description thereof is omitted here.

An interlayer insulating film 14 is provided on the interlayer insulating film 13 so as to cover the local wire 7 and the MTJ element 8. A bit line 10 (a second write wire) is provided on the interlayer insulating film 14 so as to extend in direction orthogonal to the digit line 5, in a plain view.

A contact hole 9 is provided so as to pass through the interlayer insulating film 14 and reach a surface of the MTJ element 8. The contact hole 9 is filled with a conductive film to constitute a contact plug 17.

The bit line 10 is provided so as to cover the contact plug 17 and the MTJ element 8 is electrically connected to the bit line 10 via the contact plug 17.

Next, a structure of the MTJ element 8 will be described with reference to FIG. 2.

Figure 2:
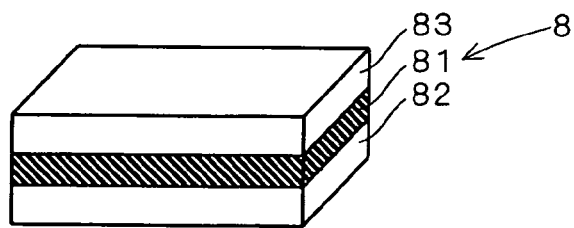
FIG. 2 is a perspective view which illustrates a structure of an MTJ element.

As shown in FIG. 2, the MTJ element 8 has a structure in which an ultrathin insulating film 81 is sandwiched between ferromagnetic material layers 82 and 83. Here, the ferromagnetic material layer 82 is provided in the side of the digit line 5.

In such structure, when current is flown between the ferromagnetic material layers 82 and 83, current tunneling the ultrathin insulating film 81 varies depending on a case that the magnetization directions are the same in the ferromagnetic material layers 82 and 83 (parallel case) or a case that the magnetization directions opposite in the ferromagnetic material layers 82 and 83 (anti-parallel case).

That is, resistance becomes low when the magnetization directions are the same, and resistance becomes high when the magnetization directions are different. A magnetic tunnel junction has two tunnel magnetic resistances (TMR) according to the magnetization directions of the ferromagnetic material layers 82 and 83 (TMR effect). The MRAM is a nonvolatile RAM which stores binary information by two combinations of magnetization directions of the ferromagnetic material layers 82 and 83.

For the ferromagnetic material layer 83, a material which is easier to inverse its direction of magnetization than the ferromagnetic material layer 82 is selected and the layer is called "free layer". On the other hand, for the ferromagnetic material layer 82, a material which maintains its direction of magnetization even if magnetic field for changing the magnetization direction in the ferromagnetic material layer 83 is given, and this layer is called "pin layer".

Therefore, with a combined magnetic field generated by applying current to the bit line 10 (FIG. 1) and the digit line 5 (FIG. 1), the magnetization direction in the free layer is controlled. As a result, it becomes possible to optionally set a parallel case and an anti-parallel case in the ferromagnetic material layers 82 and 83.

The magnetic field where a magnetization direction starts to invert is called "switching magnetic field" or "inverting magnetic field" and this field is described as "Hsw".

(B. Basic Operation)

A basic operation of the MRAM 100 will be described.

First, a data writing operation and a data reading operation of the MRAM 100 will be described with reference to FIG. 3 which illustrates a planar structure of the MRAM 100.

Figure 3:
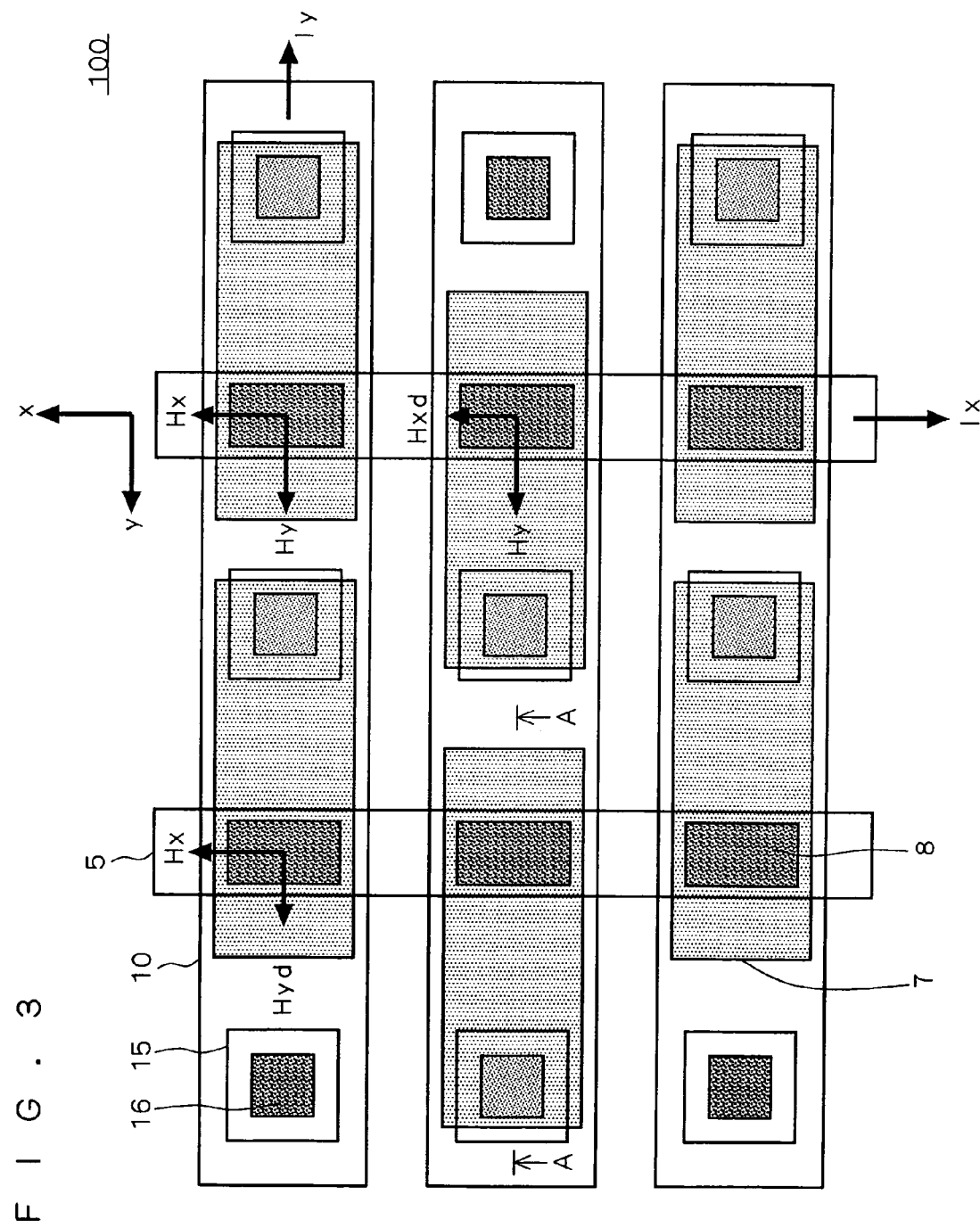
FIG. 3 is a plain view which illustrates a structure of an MRAM according to an embodiment of the present invention.

FIG. 3 schematically illustrates the MRAM 100 having a plurality of memory cells and each structure is illustrated in a plain regardless of their vertical relations. It is noted that a cross-sectional view taken along line A-A of FIG. 3 corresponds to FIG. 1; therefore, the reference numerals used in FIG. 1 are also used in FIG. 3.

As shown in FIG. 3, the plurality of MTJ elements 8 are arranged in a matrix pattern, and the digit lines 5 and bit lines 10 are arranged corresponding to the vertical and horizontal arrangements of the MTJ elements 8.

In FIG. 3, the vertical direction in view toward the drawing is shown as an X direction, and the horizontal direction is shown as a Y direction. The longer side of the rectangular MTJ element 8 is provided along the X direction and the shorter side is provided along the Y direction.

In the MRAM 100, current is applied to the digit lines 5 and bit lines 10 and, with a combined magnetic field of magnetic fields generated in each line, the magnetization directions of the MTJ elements 8 are controlled. Here, current applied to the digit lines 5 and bit lines 10 to inverse the direction of magnetization of free layers is called "write current" and respectively denoted as a current Iy and a current Ix.

Therefore, the above combined magnetic field is determined according to combinations of a bit line write magnetic field Hx generated by the current Iy in bit line 10 (bit line writing current), and a digit line write magnetic field Hy generated by the current Ix in digit line 5 (digit line write current). This is illustrated in an asteroid curved line shown in FIG. 4.

Figure 4:
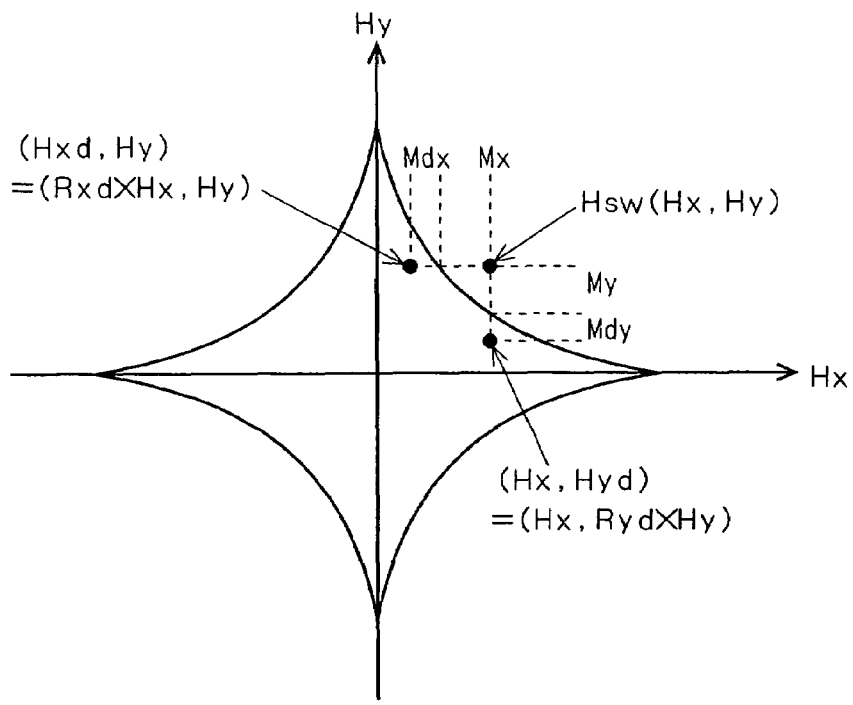
FIG. 4 is a diagram which illustrates an operating characteristic of an MRAM according to an embodiment of the present invention.

In FIG. 4, the horizontal axis represents the bit line write magnetic field Hx generated by bit line write current Iy and the vertical axis represents the digit line write magnetic field Hy generated by digit line write current Ix. The switching magnetic field Hsw required to inverse the magnetization direction in a free layer is represented in the region outside of the asteroid curved line. Thus, when a combined magnetic field is inside the asteroid curved line, the magnetization directions of the free layers are maintained.

There exist a number of switching magnetic fields for inverting the magnetization direction of the free layers. To select an optimal switching magnetic field among them, it is desirable to minimize an influence of fringing magnetic field of the digit line write magnetic field to adjacent memory cells in the direction that the bit line extends, an influence of fringing magnetic field of the bit line write magnetic field to adjacent memory cells in the direction that digit line extends, when a memory cell whose magnetization direction is to be converted to write data is considered as a central memory cell.

Figure 5:
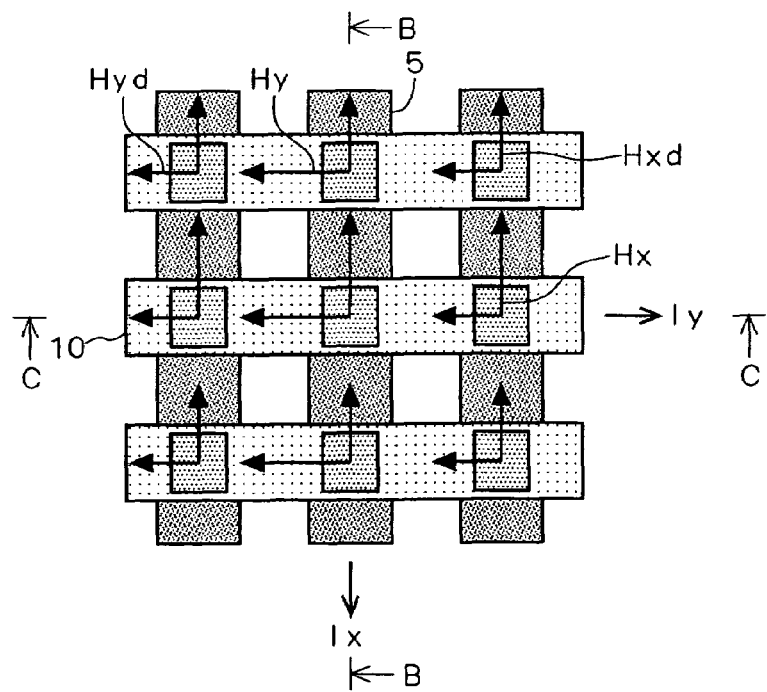
FIG. 5 is a plain view which schematically illustrates a structure of an MRAM according to an embodiment of the present invention.
Figure 6:
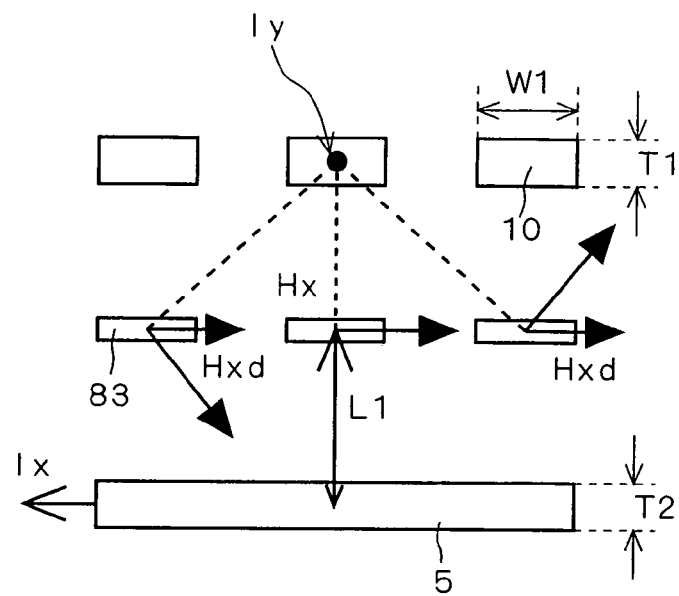
FIGS. 6 and 7 are cross-sectional views which schematically illustrate a structure of an MRAM according to an embodiment of the present invention.
Figure 7:
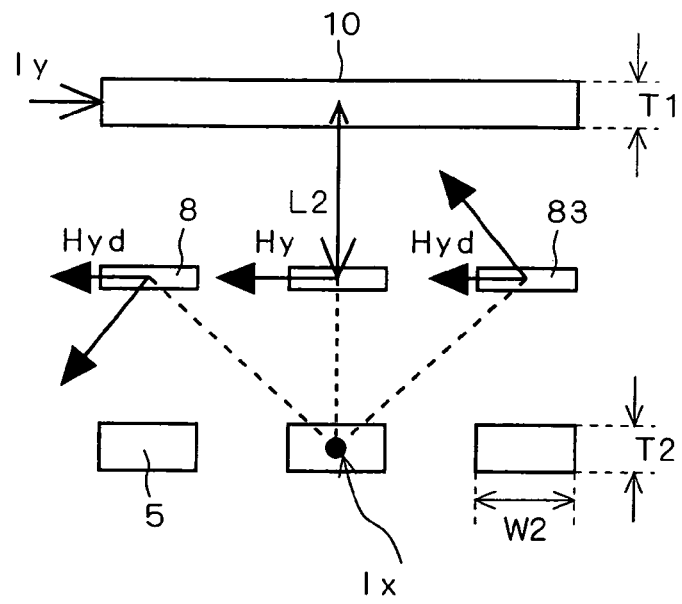

With reference to FIGS. 5 to 7, influences of fringing magnetic field of a digit line write magnetic field and fringing magnetic field of a bit line write magnetic field will be described. Also, a structure configured to minimize such influences will be described.

FIG. 5 illustrates a plain structure of the MRAM 100 shown in FIG. 3 more simply, and shows only the bit lines 10, the digit lines 5 and the MTJ elements 8.

In FIG. 5, among the MTJ elements 8 arranged in matrix pattern, the central MTJ element 8 is an MTJ element 8 included in a memory cell to which data is written. To the MTJ element 8, the bit line write magnetic field Hx and the digit line write magnetic field Hy are given. Here, other memory cells are non-selected memory cells and both of the bit line write magnetic field Hx and the digit line write magnetic field Hy are not given to those memory cells.

In FIG. 5, the fringing magnetic field of the digit line write magnetic field is represented as a Y-direction component Hyd of an in-plane magnetic field of the free layer in the MTJ element 8, and the fringing magnetic field of the bit line write magnetic field is represented as an X-direction component Hxd of an in-plane magnetic field of the free layer in the MTJ element 8.

As shown in FIG. 5, the bit line write magnetic field Hx is generated by the bit line 10 connected to the central MTJ element 8, so that the bit line write magnetic field Hx is given to all MTJ elements 8 which are connected to the bit line 10.

Further, the digit line write magnetic field Hy is generated by the digit line 5 connected to the central MTJ element 8, so that the digit line write magnetic field Hy is given to all MTJ elements 8 which are connected to the digit line 5.

To the MTJ elements 8 which are not connected to the bit line 10, fringing magnetic field Hxd of the bit line write magnetic field is given. Similarly, to the MTJ elements 8 which are not connected to the digit line 5, fringing magnetic field Hyd of the digit line write magnetic field is given.

To write data in one desirable memory cell in the MRAM 100, both of the bit line write magnetic field Hx and the digit line write magnetic field Hy are given to a desirable memory cell so as to inverse the direction of magnetization of the free layer in the MTJ element 8. However, the memory cells adjacent in the direction of bit line extension are not inverted by a disturb magnetic field (Hx, Hyd) caused by the bit line write magnetic field Hx and fringing magnetic field Hyd. The memory cells adjacent in the direction of digit line extension are not inverted by a disturb magnetic field (Hxd, Hy) caused by the digit line write magnetic field Hy and fringing magnetic field Hxd.

When a magnetic field which satisfies such requirement is described with reference to the asteroid curved line shown in FIG. 4, the write magnetic field (Hx, Hy) exists in a region outside the asteroid curved line and the disturb magnetic fields (Hx, Hyd) and (Hxd, Hy) exist in a region inside the asteroid curved line. Accordingly, to satisfy such relations, various conditions are set.

Influence of fringing magnetic field Hxd of the bit line write magnetic field is defined according to a ratio to the bit line write magnetic field Hx (Hxd/Hx), and the ratio is represented as Rxd. When the disturb magnetic field (Hxd, Hy) is expressed with the ratio Rxd, it is represented as (Rxd×Hx, Hy).

Further, influence of the fringing magnetic field Hyd of the digit line write magnetic field is defined according to a ratio to the digit line write magnetic field Hy (Hyd/Hy), and the ratio is represented as Ryd. When the disturb magnetic field (Hx, Hyd) is expressed with the ratio Ryd, it is represented as (Hx, Ryd×Hy).

Therefore, to minimize the influence of fringing magnetic field Hxd of the bit line write magnetic field and the influence of fringing magnetic field Hyd of the digit line write magnetic field at the same time, at least the ratio Rxd and the ratio Ryd are required to be equal.

When it is assumed that the asteroid curved line shown in FIG. 4 has the same intercepts for X-axis direction and Y-axis direction, and to realize random data writing with largest margin, write margins Mx and My for each write magnetic field (Hx, Hy) satisfy Mx=My, and disturb-resistant margins Mdx and Mdy for the respective memory cells adjacent in directions of digit line extension and bit line extension satisfy Mdx=Mdy. As a result, the write magnetic fields (Hx, Hy) satisfy Hx=Hy, and this is the optimal condition.

However, in fact, for the asteroid curved line shown in FIG. 4, the Hy-axis intercept is larger than the Hx-axis intercept. This means that a switching magnetic field in the case of applying current only to the Y-axis direction is larger than the switching magnetic field in the case of applying current only to the X-axis direction. Such asymmetric characteristic is seen because of a structure in which a longer side of the rectangular MTJ element 8 is provided along the X-axis, as shown in FIG. 3.

Therefore, the X-axis direction (longer side of an MTJ element) is called "easy axis direction" as the switching magnetic field is small and the magnetization direction is easily inverted, and the Y-axis direction (shorter side of an MTJ element) is called "hard axis direction".

The combined magnetic field of the bit line write magnetic field Hx and the digit line write magnetic field Hy faces the direction between the X-axis (easy axis) direction and the Y-axis (hard axis) direction. The magnetization direction inversed by the combined magnetic field faces the direction between the easy axis and the hard axis while the combined magnetic field is being applied. When writing current is stopped and combined magnetic field is turned off to be a holding condition, the magnetization direction naturally faces the easy axis direction. As just described, the actual asteroid curved line is not symmetric. However, it is possible to remove the asynunetricity by optimizing a form or structure of an MTJ element, so that the optimal condition of the write magnetic fields (Hx, Hy) may be set as Hx=Xy.

(C. Structural Optimization)

Based on the above described basic operation of the MRAM 100, an optimized structure of the MRAM 100 will be described with reference to FIGS. 6 and 7. Here, FIG. 6 is a diagram showing a sectional view as seen from line B-B of FIG. 5 and FIG. 7 is a diagram showing a sectional view as seen form line C-C of FIG. 5.

As shown in FIG. 6, the width and thickness of the bit line 10 are represented as W1 and T1, respectively, the thickness of the digit line 5 is represented as T2, and a distance from the center of the digit line 5 in the thickness direction to the center of the free layer (i.e. a ferromagnetic material layer 83) of the MTJ element 8 in thickness direction is represented as L1.

As shown in FIG. 7, the width of the digit line 5 is represented as W2, and a distance from the center of the bit line 10 in the thickness direction to the center of the free layer of the MTJ element 8 in the thickness direction is represented as L2.

Here, to secure a write margin as large as possible, the write magnetic field is set to satisfy Hx=Hy. Also, the digit line write current density Jx is applied to the digit line write current Ix, and the bit line write current density Jy is applied to the bit line write current Iy. Accordingly, the following expressions (1) to (4) are obtained.

$$Hx=k \cdot Iy/L2 \quad (1)$$

$$Iy=Jy(W1 \cdot T1) \quad (2)$$

$$Hy=k \cdot Ix/L1 \quad (3)$$

$$Ix=Jx(W2 \cdot T2) \quad (4)$$

Here, "k" is a proportionality constant in the expressions (1) and (2).

Thus, the relation between a write magnetic field and current density is shown in the following expressions (5) and (6).

$$Hx=k \cdot Jy(W1 \cdot T1)/L2 \quad (5)$$

$$Hy=k \cdot Jx(W2 \cdot T2)/L1 \quad (6)$$

Further, in a condition of Hx=Hy, the following expressions (7) to (9) are obtained.

$$Jy(W1 \cdot T1)/L2=Jx(W2 \cdot T2)/L1 \quad (7)$$

$$Jx/Jy=(W1 \cdot T1)/L2/[(W2 \cdot T2)/L1]=[(W1 \cdot T1)/(W2 \cdot T2)](L1/L2) \quad (8)$$

$$(W2 \cdot T2)/(W1 \cdot T1)=(L1/L2) \quad (Jy/Jx) \quad (9)$$

In the MRAM 100, to ensure reliability for both of the bit lines 10 and the digit lines 5 at the same time, such a structure in which one operating life is shorter than that of the other cannot be employed. Ideally, it is best to satisfy Jy/Jx=1, so that the write wires come to have the same operating lives. To ensure margin for structural design, a limitation is provided so that current density of one line is equal to or less than three times as that of the other line. This limitation is a requirement to control the difference between the operating lives of the lines to be less than 10.

In the case of (W2·T2)≦(W1·T1), the cross-sectional area of the digit line 5 is smaller than the cross-sectional area of the bit line 10. Thus, digit line write current density Jx becomes higher than bit line write current density Jy, and a condition of Jy/Jx≧⅓ is obtained. In this situation, it is set to L1≧L2 to satisfy Hx=Hy.

To achieve this, it is required to satisfy a relation represented in the following expression (10).

$$(1/3) \cdot (L1/L2) \leq (W2 \cdot T2)/(W1 \cdot T1) \leq 1 \quad (10)$$

Similarly, in the case of (W2·T2)≧(W1·T1), the cross-sectional area of the bit line 10 is smaller than the cross-sectional area of the digit line 5. Thus, the bit line write current density Jy becomes higher than the digit line write current density Jx, and a condition of Jy/Jx≦3 is obtained. In this situation, it is set to L1≦L2 to satisfy Hx=Hy.

To achieve this, it is required to satisfy a relation represented in the following expression (11).

$$1 \leq (W2 \cdot T2)/(W1 \cdot T1) \leq 3 \cdot (L1/L2) \quad (11)$$

In use of a step function H(x), in the case of H(x)=0, it is set as x<0, and in the case of H(x)=1, it is set as x≧0. As a result, the above expressions (10) and (11) can be integrated and a design condition of a memory cell structure can be represented in the following expression (12).

$$(\tfrac{1}{3}) \cdot [(L1/L2) \cdot H(L1-L2)+3 \cdot H(L2-L1)] \leq (W2 \cdot T2)/(W1 \cdot T1) \leq 3 \cdot [(\tfrac{1}{3}) \cdot H(L1-L2)+(L1/L2) \cdot H(L2-L1)] \quad (12)$$

To obtain the above expression, the writing magnetic field is set to satisfy Hx=Hy and the write current density is in a condition of ⅓≦Jy/Jx≦3.

However, these are assumptions based on an ideal case and, in fact, it may not always satisfy the conditions of Hx=Hy or ⅓≦Jy/Jx≦3.

In the expression (12), a write margin is set as large as possible and the difference between the write current densities of the digit line 5 and bit line 10 are controlled under a predetermined range. Accordingly, the difference between the operating lives of both lines is controlled within a predetermined range. The expression (12) provides a condition to maintain the reliability of both lines.

Therefore, as long as this condition is maintained, the write margin is large enough and a relation close to a condition of Hx=Hy is kept. Further, it is considered that a relation close to a condition of ⅓≦Jy/Jx≦3 is kept to ensure the reliability of the lines at the same time. Thus, the expression (12) is a fundamental condition which the MRAM 100 is required to satisfy.

According to the above description, one digit line and one bit line are provided to one memory cell. However, a plurality of digit lines and bit lines may be provided to one memory as lines for supporting data writing. Assuming such situation, a total area (section in width direction) in the most supportive part for writing among the digit lines and bit lines are represented as S2 and S1 respectively. Then, the expression (12) can be represented as the following expression (13).

$$(\tfrac{1}{3}) \cdot [(L1/L2) \cdot H(L1-L2)+3 \cdot H(L2-L1)] \leq S2/S1 \leq 3 [(\tfrac{1}{3}) \cdot H(L1/L2)+(L1 \quad L2) \cdot H(L2-L1)] \quad (13)$$

In the case that one digit line and one bit line are provided to one memory cell, obviously, S2 in the expression (13) is an area of a section of one digit line, and S1 is an area of a section of one bit line.

The expression (13) can be divided into the following expressions (14) and (15).

$$(\tfrac{1}{3}) \cdot (L1/L2) \leq S2/S1 \leq 1 \quad (14)$$

$$1 \leq S2/S1 \leq 3(L1/L2) \quad (15)$$

Here, the expression (14) represents a condition for the case that L1/L2≧1, and the expression (15) represents a condition for the case that L1/L2≦1.

Arranging the distances L1, L2, and cross-sectional areas S1, S2 so as to satisfy the conditions of the expressions (14) and (15) results in preventing an occurrence of large difference between each current density of the digit line and the bit line. Accordingly, the difference of the operating lives of the lines is kept less than 10 and reliability for both lines can be ensured.

One example of concrete numeric values of each structure by taking a semiconductor device called "130 nm process generation" will be described as an example.

First, an ideal condition is in that write densities satisfy Jy/Jx=1, the wiring width of each digit line 5 and bit line 10 are the same, and the position of the free layer of the MTJ element 8 satisfies L1:L2=1:1 which is, concretely, placed about 230 nm from the lower surface of the bit line 10.

The thickness of the digit line 5 and the thickness of the bit line 10 are approximately the same and are about 300 nm. The interval between an upper surface of the digit line 5 and a lower surface of the bit line 10 is about 450 nm.

Comparing to the ideal condition, changes of the memory cell are examined in the case that Jy/Jx is ⅓ or 3.

To limit the condition, a case, in that current density of the digit line 5 relatively increases, is considered. That is, a case in a condition of Jy/Jx=⅓ is considered.

By changing only the position of the MTJ element 8 to realize such condition, it is set as L1:L2=3:1. It is equivalent that the position of the MTJ element 8 is moved to a place of 40 nm from the lower surface of the bit line 10 from a place of 230 nm from the lower surface of the bit line 10.

Next, a case, in which the ratio of the width of the bit line 10 and the width of the bit line 10 is set about 2:1 to achieve a condition of Jy/Jx=⅓, is considered.

In this case, the position of the MTJ element 8 is also required to be changed to L1:L2=3:2. It is equivalent that the position of the MTJ element 8 is moved to a place of 150 nm from the lower surface of the bit line 10 from a place of 230 nm from the lower surface of the bit line 10.

As described above, an optimized structure of the MRAM 100 can be obtained by regulating the positional relation between the write wires and the MTJ element 8 to ensure reliability for both write lines, i.e., the bit line 10 and the digit line 5, according to the relation between L1/L2 representing the positional relation between the MTJ element 8 and digit line or bit line, and S1 and S2 representing cross-sectional areas of the bit line 10 and the digit line 5.

(D. Selection of Wire Materials)

(D-1. First Method for Selecting)

Not only satisfying the above condition but also setting the wiring width W1 of the bit line 10 and the wiring width W2 of the digit line 5 close to each other result in easier and smaller layout of a memory cell.

Because the thickness T1 of the bit line 10 and the thickness T2 of the digit line 5 are the thickness of a line which has approximately the same pitch and is applied to memory cell, in view of microfabrication, it is advantageous that approximately the same thickness is used. Therefore, it is advantageous that the cross-sectional areas S1 and S2 are set in an approximately same value in view of layout creation and microfabrication.

Accordingly, in the case of L1>L2, it is desirable that a metal material having higher melting point is used as a wiring material of the bit line 10 to make wiring sectional dimension S1 of the bit line 10 smaller.

At the same time, in the case of L2<L1, it is desirable that a metal material having higher melting point is used as a wiring material of the digit line 5 to make wiring sectional dimension S2 of the digit line 5 smaller.

In detail, it is desirable to use material which is so called refractory metal and for semiconductor devices. Here are those materials in order of higher melting point; material of tungsten (W) series, material of titanium (Ti) series, material of copper (Cu) series, and material of aluminum (Al) series.

As materials of W series, there are pure tungsten and tungsten silicide ($WSi_2$). When pure tungsten is used, titanium nitride may be used as barrier metal.

As materials of Ti series, there are titanium nitride (TiN) and titanium silicide ($TiSi_2$). As materials of Cu series, there are pure copper formed by plating technique and pure copper formed by sputtering technique. As materials of Al series, there are aluminum silicide (AlSi), AlSiCu, and AlCu.

Other than the above, in use of tantalum nitride as a barrier metal, tantalum may be employed.

When it is assumed that such various kinds of wiring materials are used, the digit line 5 and the bit line 10 may be made of different wiring materials. As a result, more advantageous structure can be obtained in view of providing layout and microfabrication, comparing to the case that the same material are used for both lines.

For example, in the case of L1>L2, the bit line 10 is made of a material having higher melting point than the material of the digit line 5, and in the case of L2>L1, the digit line 5 is made of a material having higher melting point than the material of the bit line 10.

In more detail, the following combinations may be employed. (in the case of L1>L2)

| Digit line material | Bit line material |
|---|---|
| Al series | Cu series |
| Al series | W series, Ti series |
| Cu series | W series, Ti series |

(in the case of L1<L2)

| Digit line material | Bit line material |
|---|---|
| Cu series | Al series |
| W series, Ti series | Al series |
| W series, Ti series | Cu series |

As described above, in the case of L1>L2, the cross-sectional area S1 of the bit line 10 can be made smaller by using a metal material having higher melting point than that of the digit line 5. In the case of L2<L1, the cross-sectional area S2 of the digit line 5 can be made smaller by using a metal material having higher melting point than that of the bit line 10. As a result, more advantageous structure can be obtained in view of providing layout and microfabrication.

(D-2. Second Method for Selecting)

The above description is provided based on an assumption that the cross-sectional area S1 of the bit line 10 and the cross-sectional area S2 of the digit line 5 are the same. However, in the case of S2<S1, current density of the digit line 5 becomes high and it become difficult to ensure the reliability. On the other hand, in the case of S2>S1, current density of the bit line 10 becomes high and it become difficult to ensure the reliability.

Therefore, in the case of S2<S1, it is advantageous to provide the digit line 5 with a metal material having higher melting point than the that of bit line 10 to ensure its reliability. Similarly, in the case of S2>S1, it is advantageous to provide the bit line 10 with a metal material having higher melting point than the that of digit line 5 to ensure its reliability.

In more detail, the following combinations may be employed.

(in the case of S2<S1)

| Digit line material | Bit line material |
|---|---|
| Cu series | Al series |
| W series, Ti series | Al series |
| W series, Ti series | Cu series |

(in the case of S2>S1)

| Digit line material | Bit line material |
|---|---|
| Al series | Cu series |
| Al series | W series, Ti series |
| Cu series | W series, Ti series |

The above description is provided based on an assumption, about the bit line 10 and the digit line 5, the current density of one of the lines is limited to be equal to or less than three times as that of the other line. However, even when the current density of one of the lines is limited to be equal to or less than four or five times as that of the other line, the difference between the operating lives of the wires can be smaller so that an object for ensuring reliability of the write wires at the same time can be achieved.

While the invention has been shown and described in detail, the foregoing description is in all aspects illustrative and not restrictive. It is therefore understood that numerous modifications and variations can be devised without departing from the scope of the invention.

What is claimed is:

1. A magnetic memory device comprising:

first and second write wires that intersect each other in a non-contact manner; and a magnetic tunnel junction element which is arranged in an intersection of said first and second write wires and includes a magnetic tunnel junction, wherein said magnetic tunnel junction element has a free layer consisting of a ferromagnetic material in which a magnetization direction is variable with a magnetic field generated by current flowing through said first and second write wires, and in the case where a distance between a center of said first write wire in a thickness direction and a center of said free layer in the thickness direction is represented as $L1$, a distance between a center of said second write wire in the thickness direction and a center of said free layer in the thickness direction is represented as $L2$, a cross-sectional area of said first write wire in a width direction is represented as $S2$ and a cross-sectional area of said second write wire in a width direction is referred to as $S1$, said distance $L1$, said distance $L2$, said cross-sectional area $S1$, and said cross-sectional area $S2$ are set in such a manner that:

when a ratio of said distance $L1$ to said distance $L2$ is $L1/L2 \geq 1$ a relation of $(1/3) \cdot (L1/L2) \leq S2/S1 \leq 1$ is satisfied;

when the ratio of said distance $L1$ to said distance $L2$ is $L1/L2 \leq 1$, a relation of $1 \leq S2/S1 \leq 3(L1/L2)$ is satisfied;

when a relation between said distance $L1$ and said distance $L2$ is $L1 > L2$, said second write wire is made of a metal material having higher melting point than a melting point of a metal material for said first write wire, and as a combination of metal materials for said first write wire and said second write wire, one combination is selected from among aluminum series and copper series, aluminum series and tungsten series, aluminum series and titanium series, copper series and tungsten series and copper series and titanium series; and when the relation between said distance $L1$ and said distance $L2$ is $L1 < L2$, said first write wire is made of a metal material having higher melting point than a melting point of a material for said second write wire, and as a combination of metal materials for said first write wire and said second write wire, one combination is selected from among copper series and aluminum series, tungsten series and aluminum series, titanium series and aluminum series, tungsten series and copper series, and titanium series and copper series.

2. A magnetic memory device comprising:

first and second write wires that intersect each other in a non-contact manner; and a magnetic tunnel junction element which is arranged in an intersection of said first and second write wires and includes a magnetic tunnel junction, wherein said magnetic tunnel junction element has a free layer consisting of a ferromagnetic material in which a magnetization direction is variable with a magnetic field generated by current flowing through said first and second write wires, and in the case where a distance between a center of said first write wire in a thickness direction and a center of said free layer in the thickness direction is represented as $L1$, a distance between a center of said second write wire in the thickness direction and a center of said free layer in the thickness direction is represented as $L2$, a cross-sectional area of said first write wire in a width direction is represented as $S2$ and a cross-sectional area of said second write wire in a width direction is referred to as $S1$, said distance $L1$, said distance $L2$, said cross-sectional area $S1$, and said cross-sectional area $S2$ are set in such a manner that:

when a ratio of said distance $L1$ to said distance $L2$ is $L1/L2 \geq 1$, a relation of $(1/3) \cdot (L1/L2) \leq S2/S1 \leq 1$ is satisfied;

when the ratio of said distance $L1$ to said distance $L2$ is $L1/L2 \leq 1$, a relation of $1 \leq S2/S1 \leq 3(L1/L2)$ is satisfied;

when a relation between said cross-sectional area $S1$ and said cross-sectional area $S2$ is $S1 > S2$, said first write wire is made of a metal material having higher melting point than a melting point of a material for said second write wire, and as a combination of metal materials for said first write wire and said second write wire, one combination is selected from among copper series and aluminum series, tungsten series and aluminum series, titanium series and aluminum series, tungsten series and copper series, and titanium series and copper series; and when the relation between said cross-sectional area $S1$ and said cross-sectional area $S2$ is $S1 < S2$, said second write wire is made of a metal material having higher melting point than a melting point of a material for said first write wire, and as a combination of metal materials for said first write wire and said second write wire, one combination is selected from among aluminum series and copper series, aluminum series and tungsten series, aluminum series and titanium series, copper series and tungsten series, and copper series and titanium series.

3. The magnetic memory device according to claim 1, wherein as a metal material of said aluminum series, one metal material is selected from among aluminum silicide (AlSi), AlSiCu, and AlCu, and as a metal material for said copper series, pure copper formed by plating technique or by sputtering technique is selected, and as a metal material for said tungsten series, pure tungsten or tungsten suicide ($WSl_2$) is selected, and as a metal material for said titanium series, titanium nitride (TiN) or titanium silicide ($TiSi_2$) is selected.

4. The magnetic memory device according to claim 2, wherein as a metal material for said aluminum series, one material is selected from among aluminum silicide (AlSi), AlSiCu, and AlCu, and as a metal material for said copper series, pure copper formed by plating technique or by sputtering technique is selected, and as a metal material for said tungsten series, pure tungsten or tungsten suicide ($WSi_2$) is selected, and as a metal material for said titanium series, titanium nitride (TiN) or titanium silicide ($TiSi_2$) is selected.

* * * * *